United States Patent
Ahn et al.

(10) Patent No.: US 9,647,659 B1
(45) Date of Patent: May 9, 2017

(54) SEMICONDUCTOR DEVICES

(71) Applicant: SK hynix Inc., Icheon-si Gyeonggi-do (KR)

(72) Inventors: Jung Il Ahn, Seongnam-si (KR); Kyung Hoon Kim, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/211,117

(22) Filed: Jul. 15, 2016

(30) Foreign Application Priority Data

Feb. 25, 2016 (KR) ........................ 10-2016-0022874

(51) Int. Cl.
*H03K 17/16* (2006.01)
*H03K 19/003* (2006.01)
*H03K 19/00* (2006.01)

(52) U.S. Cl.
CPC ..... *H03K 19/0005* (2013.01); *H03K 19/0013* (2013.01); *H03K 19/00384* (2013.01)

(58) Field of Classification Search
CPC .......... H03K 19/0005; H03K 19/0013; H03K 19/00384
USPC .......................................................... 326/30
See application file for complete search history.

(56) References Cited

U.S. PATENT DOCUMENTS

| | | | |
|---|---|---|---|
| 2008/0054981 A1* | 3/2008 | Hosoe .............. | H03K 19/00384 327/333 |
| 2008/0143377 A1* | 6/2008 | Cho ..................... | G11C 29/028 326/30 |
| 2008/0157811 A1* | 7/2008 | Lee ...................... | H03K 17/002 326/30 |
| 2012/0182044 A1* | 7/2012 | Oh ........................ | G11C 5/063 326/30 |

FOREIGN PATENT DOCUMENTS

KR              101046242 B1        7/2011

* cited by examiner

*Primary Examiner* — Daniel D Chang
(74) *Attorney, Agent, or Firm* — William Park & Associates Ltd.

(57) ABSTRACT

A semiconductor device with impedance calibration includes a first channel circuit of a first channel and a second channel circuit of a second channel. The first channel circuit is configured to drive a first node in response to a flag signal, generate a start signal from a signal of the first node to execute a first calibration operation in response to a mask signal, and generate and output an end signal after termination of the first calibration operation. The second channel circuit is configured to generate a transmission start signal from the end signal to execute a second calibration operation.

20 Claims, 6 Drawing Sheets

SEMICONDUCTOR DEVICES

CROSS-REFERENCE TO RELATED APPLICATIONS

The present application claims priority under 35 U.S.C 119(a) to Korean Patent Application No. 10-2016-0022874, filed on Feb. 25, 2016, which is herein incorporated by references in its entirety.

BACKGROUND

1. Technical Field

Embodiments of the present disclosure relate to semiconductor devices and, more particularly, to semiconductor devices having impedance calibration circuits.

2. Related Art

Within semiconductor systems, it is generally necessary to match the impedance of a transmission line (e.g., a transmission channel) with the corresponding termination impedance of a termination resistor in order to prevent undesirable signal reflections. Such signal reflections act as noise on the transmission line in relation to signals subsequently transmitted on the transmission line.

Termination resistors of conventional semiconductor modules or systems are often disposed outside semiconductor chips constituting the semiconductor modules or systems. However, in the event that the termination resistors are disposed outside high performance semiconductor chips such as double data rate 2 (DDR2) synchronous dynamic random access memory (SDRAM) chips, there may be some limitations in preventing undesirable signal reflections.

Recently, termination resistors have been provided inside high performance semiconductor chips to prevent undesirable signal reflections. In particular, on-die termination (ODT) circuits have been widely used in semiconductor modules and/or semiconductor systems. The ODT circuits include switching circuits, which are turned on or off to control currents that flow therein. Thus, power consumption of the semiconductor modules having ODT circuits may be reduced as compared with semiconductor modules having termination resistors disposed outside the semiconductor chips.

Resistance values of the ODT circuits may vary according to process/voltage/temperature (PVT) conditions. Hence, it may be necessary to calibrate the resistance values of the ODT circuits using impedance calibration circuits before the ODT circuits are utilized.

The impedance calibration circuits may employ a comparator that compares a reference voltage with a resistance value of a resistor (e.g., an external resistor) connected to a pad, so as to generate a pull-up code and a pull-down code for calibrating a resistance value of the ODT circuit. The external resistor connected to the pad may have a constant resistance value (e.g., 240Ω) regardless of the PVT condition.

SUMMARY

Various embodiments are directed to semiconductor devices having impedance calibration circuits.

According to an embodiment, a semiconductor device with impedance calibration is described. The semiconductor device includes a first channel circuit of a first channel and a second channel circuit of a second channel. The first channel circuit drives a first node in response to a flag signal, generates a start signal from a signal of the first node to execute a first calibration operation in response to a mask signal, and generates and outputs an end signal after termination of the first calibration operation. The second channel circuit generates a transmission start signal from the end signal to execute a second calibration operation. The flag signal is set to a first level if a calibration command is inputted to a second node included in the second channel circuit, and is set to a second level if the calibration command is inputted to the first node included in the first channel circuit.

According to another embodiment, a semiconductor device with impedance calibration includes a first command input/output (I/O) circuit configured to be included in a first channel circuit of a first channel and configured to receive a signal of a first pad to drive a first node in response to a first flag signal or to receive a signal of the first node to drive the first pad in response to the first flag signal, a first start signal generation circuit configured to be included in the first channel circuit and configured to buffer a signal of the first node to generate a first start signal for a first calibration operation in response to a first mask signal, and a first end pulse input/output (I/O) circuit configured to be included in the first channel circuit and configured to drive a second pad in response to a first end signal generated after termination of the first calibration operation or to drive a first transmission start signal for the first calibration operation in response to a signal of the second pad.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
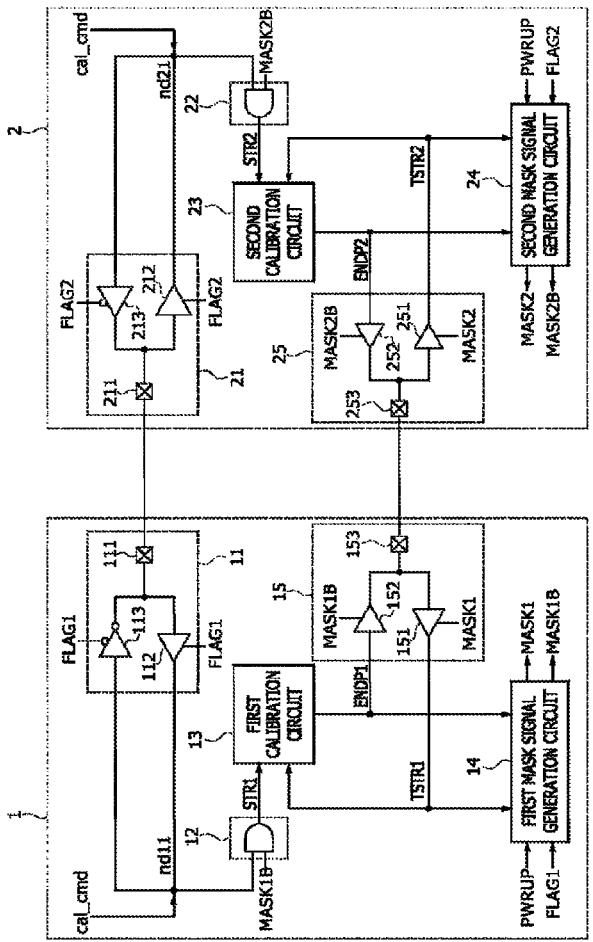
FIG. 1 is a block diagram illustrating a semiconductor device according to an embodiment of the present disclosure.

Referring to FIG. 1, a semiconductor device configured with impedance calibration according to an embodiment is shown. Although a specific circuit configuration for the semiconductor device is shown, other suitable circuit configurations may be utilized.

Further, the logic levels of the signals may be different from or the opposite of those described. For example, a signal described as having a logic "high" level may alternatively have a logic "low" level, and a signal described as having a logic "low" level may alternatively have a logic "high" level.

In FIG. 1, the semiconductor device may include a first channel circuit 1 of a first channel and a second channel circuit 2 of a second channel.

The first channel circuit 1 of the first channel may include a first command input/output (I/O) circuit 11, a first start signal generation circuit 12, a first calibration circuit 13, a first mask signal generation circuit 14 and a first end pulse I/O circuit 15.

The second channel circuit 2 of the second channel may include a second command I/O circuit 21, a second start signal generation circuit 22, a second calibration circuit 23, a second mask signal generation circuit 24 and a second end pulse I/O circuit 25.

In the first channel circuit 1, the first command I/O circuit 11 may include a first pad 111, a first input driver 112 and a first output driver 113. The first pad 111 may be connected to a third pad 211 to receive or output a calibration command cal_cmd through the third pad 211. The first input driver 112 of the first channel circuit 1 may receive the calibration command cal_cmd inputted to a node nd21 through the first pad 111 to drive a node nd11, in response to a first flag signal FLAG1. The first output driver 113 may receive a signal of the node nd11 to drive the first pad 111, in response to the first flag signal FLAG1.

If the calibration command cal_cmd is inputted to the node nd21 included in the second channel circuit 2, the first flag signal FLAG1 may be set to a logic "high" level to activate the first input driver 112 and to deactivate the first output driver 113. If the calibration command cal_cmd is inputted to the node nd11, the first flag signal FLAG1 may be set to a logic "low" level to deactivate the first input driver 112 and to activate the first output driver 113.

The first start signal generation circuit 12 may buffer a signal of the node nd11 to output the buffered signal as a first start signal STR1 from a signal of the node nd11 to execute a first calibration operation in response to a first inverted mask signal MASK1B and in one example, a signal of the node nd11. The first inverted mask signal MASK1B may be set to have a logic "high" level from a point of time that a power-up period terminates.

During this time, an operation for calibrating may be performed. The operation for calibrating may be, for example, an operation for calibrating an impedance for proper impedance matching. For example, the operation for calibrating may be for calibrating an impedance of an on-die termination (ODT) circuit (not shown in FIG. 1) included in the first channel circuit 1. Resistance values of an ODT circuit may need to be calibrated since they may vary according to process/voltage/temperature (PVT) conditions. The operation may be referred to as a "first calibration operation."

The level of the first inverted mask signal MASK1B may be switched from the logic "high" level to a logic "low" level when the first calibration operation is terminated.

The first calibration circuit 13 may execute the first calibration operation in response to the first start signal STR1. More specifically, the first calibration circuit 13 may execute the first calibration operation if the first start signal STR1 is enabled to have a logic "high" level. The first calibration circuit 13 may generate a first end signal ENDP1 to include a pulse which is created at a point in time when the first calibration operation terminates.

The first calibration circuit 13 may execute the first calibration operation in response to a first transmission start signal TSTR1. More specifically, the first calibration circuit 13 may execute the first calibration operation if the first transmission start signal TSTR1 is enabled to have a logic "high" level.

At this time, another operation for calibrating may be performed. This operation for calibrating may also be an operation for calibrating an impedance for proper impedance matching. For example, the operation for calibrating may be for calibrating an impedance of an ODT circuit (not shown in FIG. 1) included in the second channel circuit 2. Again, resistance values of an ODT circuit may need to be calibrated since they may vary according to PVT conditions. The operation may be referred to as a "second calibration operation."

The first transmission start signal TSTR1 may correspond to a signal that a second end signal ENDP2, which includes a pulse created at a point in time when the second calibration operation terminates, is transmitted through the second end pulse I/O circuit 25 and the first end pulse I/O circuit 15.

The first mask signal generation circuit 14 may generate a first mask signal MASK1 and the first inverted mask signal MASK1B in response to a power-up signal PWRUP, the first flag signal FLAG1, the first end signal ENDP1 and the first transmission start signal TSTR1. More particularly, the first mask signal generation circuit 14 may generate the first mask signal MASK1 with a logic "low" level and the first inverted mask signal MASK1B with a logic "high" level, in response to the first transmission start signal TSTR1 which is disabled to have a logic "low" level. The first mask signal generation circuit 14 may generate the first mask signal MASK1 with a logic "low" level and the first inverted mask signal MASK1B with a logic "high" level, if the power-up period terminates and at least one of the first mask signal MASK1 and the first inverted mask signal MASK1B are driven in response to the first flag signal FLAG1 is set to have a logic "high" level, the first end signal ENDP1, and in one example, the first transmission start signal TSTR1. The first mask signal generation circuit 14 may generate the first mask signal MASK1 with a logic "high" level and the first inverted mask signal MASK1B with a logic "low" level, if a pulse (having a logic "high" level) of the first end signal ENDP1 is created by a termination of the first calibration operation.

The first end pulse I/O circuit 15 may include a second input driver 151, a second output driver 152 and a second pad 153. The second pad 153 may be connected to a fourth pad 253 to output the first end signal ENDP1 through the fourth pad 253 or to receive the second end signal ENDP2 from the fourth pad 253. The second input driver 151 may receive the second end signal ENDP2 through the second pad 153 to drive the first transmission start signal TSTR1 in response to the mask signal MASK1. The second output driver 152 may receive the first end signal ENDP1 to drive the second pad 153 in response to the first inverted mask signal MASK1B.

In the second channel circuit 2, the second command I/O circuit 21 may include the third pad 211, a third input driver 212 and a third output driver 213. The third pad 211 may be connected to the first pad 111 to receive or output the calibration command cal_cmd through the first pad 111. The third input driver 212 may receive the calibration command cal_cmd through the third pad 211 to drive a node nd21, in response to a second flag signal FLAG2. The third output driver 213 may receive a signal of the node nd21 to drive the third pad 211, in response to the second flag signal FLAG2.

If the calibration command cal_cmd is inputted to the node nd11 included in the first channel circuit 1, the second flag signal FLAG2 may be set to a logic "high" level to activate the third input driver 212 and to deactivate the third output driver 213. If the calibration command cal_cmd is inputted to the node nd21, the second flag signal FLAG2 may be set to a logic "low" level to deactivate the third input driver 212 and to activate the third output driver 213.

The second start signal generation circuit 22 may buffer a signal of the node nd21 to output the buffered signal as a second start signal STR2 in response to a second inverted mask signal MASK2B. The second inverted mask signal MASK2B may be set to have a logic "high" level until the power-up period terminates. A level of the second inverted mask signal MASK2B may be switched from the logic "high" level to a logic "low" level when the second calibration operation terminates. The second start signal generation circuit 22 may buffer a signal of the node nd21 to output the buffered signal as the second start signal STR2 at a point in time when the power-up period terminates.

The first calibration circuit 23 may execute the second calibration operation in response to the second start signal STR2. More specifically, the second calibration circuit 23 may execute the second calibration operation if the second start signal STR2 is enabled to have a logic "high" level. The second calibration circuit 23 may generate the second end signal ENDP2 to include a pulse which is created at a point in time when the second calibration operation terminates.

The second calibration circuit 23 may execute the second calibration operation in response to a second transmission start signal TSTR2. More specifically, the second calibration circuit 23 may execute the second calibration operation if the second transmission start signal TSTR2 is enabled to have a logic "high" level. The second transmission start signal TSTR2 may be generated from that the first end signal ENDP1, which includes a pulse created at a point in time when the first calibration operation terminates, is transmitted through the first end pulse I/O circuit 15 and the second end pulse I/O circuit 25.

The second mask signal generation circuit 24 may generate a second mask signal MASK2 and the second inverted mask signal MASK2B in response to the power-up signal PWRUP, the second flag signal FLAG2, the second end signal ENDP2 and the second transmission start signal TSTR2. More particularly, the second mask signal generation circuit 24 may generate the second mask signal MASK2 with a logic "low" level and the second inverted mask signal MASK2B with a logic "high" level in response to the second transmission start signal TSTR2 which is disabled to have a logic "low" level. The second mask signal generation circuit 24 may generate the second mask signal MASK2 with a logic "low" level and the second inverted mask signal MASK2B with a logic "high" level, if the power-up period terminates and the second flag signal FLAG2 is set to have a logic "high" level. The second mask signal generation circuit 24 may generate the second mask signal MASK2 with a logic "high" level and the second inverted mask signal MASK2B having a logic "low" level, if a pulse (having a logic "high" level) of the second end signal ENDP2 is created by termination of the second calibration operation.

The second end pulse I/O circuit 25 may include a fourth input driver 251, a fourth output driver 252 and the fourth pad 253. The fourth pad 253 may be connected to the second pad 153 to output the second end signal ENDP2 through the second pad 153 or to receive the first end signal ENDP1 from the second pad 153. The fourth input driver 251 may receive the first end signal ENDP1 through the fourth pad 253 to drive the second transmission start signal TSTR2 in response to a signal from the fourth pad 253. The fourth output driver 252 may receive the second end signal ENDP2 to drive the fourth pad 253.

Figure 2:
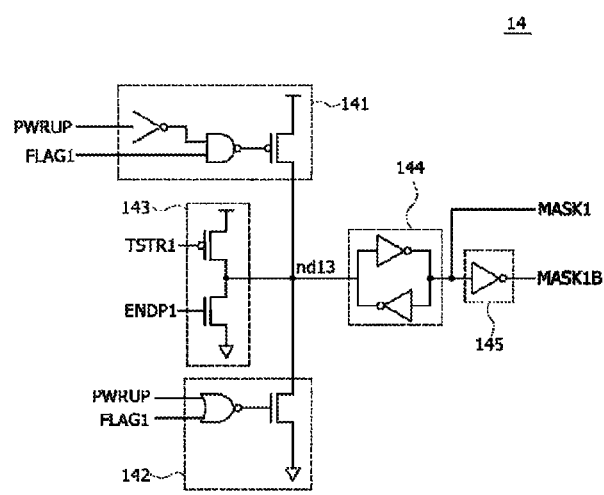
FIG. 2 is a circuit diagram illustrating a first mask signal generation circuit which may be included in the first channel circuit of the semiconductor device of FIG. 1.

Referring to FIG. 2, a first mask signal generation circuit 14 is shown. The first mask signal generation circuit 14 may be the first mask signal generation circuit 14 of the first channel circuit 1 shown and described in relation to FIG. 1; however, other suitable circuit configurations may be utilized. Also, logic levels of signals may be different from or the opposite of those described. For example, a signal described as having a logic "high" level may alternatively have a logic "low" level, and a signal described as having a logic "low" level may alternatively have a logic "high" level.

In the embodiment of FIG. 2, the first mask signal generation circuit 14 may include a first drive circuit 141, a second drive circuit 142, a third drive circuit 143, a latch circuit 144 and a buffer circuit 145.

The first drive circuit 141 may pull up a node nd13 to a logic "high" level in response to the power-up signal PWRUP and the first flag signal FLAG1. The first drive circuit 141 may terminate an operation for driving the node nd13 in response to the power-up signal PWRUP having a logic "high" level during the power-up period. The first drive circuit 141 may drive the node nd13 to a logic "high" level if the first flag signal FLAG1 has a logic "high" level by the calibration command cal_cmd inputted to the second channel circuit 2 while the power-up signal PWRUP has a logic "low" level.

The second drive circuit 142 may pull down the node nd13 to a logic "low" level in response to the power-up signal PWRUP and the first flag signal FLAG1. The second drive circuit 142 may terminate an operation for driving the node nd13 in response to the power-up signal PWRUP having a logic "high" level during the power-up period. The second drive circuit 142 may drive the node nd13 to a logic "low" level if the first flag signal FLAG1 has a logic "low" level by the calibration command cal_cmd inputted to the first channel circuit 1 (FIG. 1) while the power-up signal PWRUP has a logic "low" level.

The third drive circuit 143 may drive the node nd13 in response to the first transmission start signal TSTR1 and the first end signal ENDP1. The third drive circuit 143 may pull up the node nd13 to a logic "high" level if the first transmission start signal TSTR1 has a logic "low" level. The third drive circuit 143 may pull down the node nd13 to a logic "low" level if the first end signal ENDP1 has a logic "high" level.

The latch circuit 144 may latch a signal of the node nd13. The latch circuit 144 may latch a signal of the node nd13 to generate the first mask signal MASK1. The buffer circuit 145 may inversely buffer the first mask signal MASK1 to generate the first inverted mask signal MASK1B.

Figure 3:
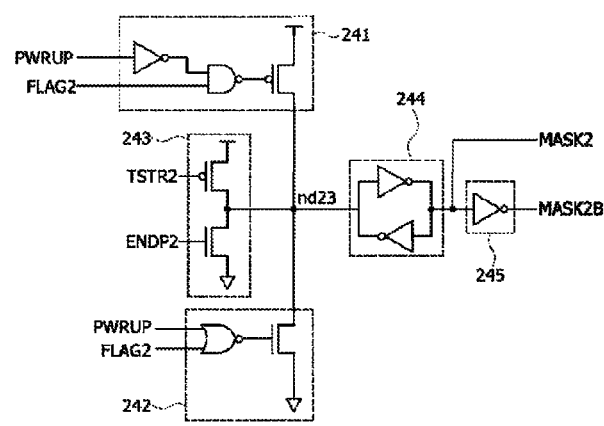
FIG. 3 is a circuit diagram illustrating a second mask signal generation circuit which may be included in the second channel circuit of the semiconductor device of FIG. 1.

Referring to FIG. 3, a second mask signal generation circuit 24 is shown. The second mask signal generation circuit 24 of FIG. 3 may be the second mask signal generation circuit 24 of the second channel circuit 2 shown and described above in relation to FIG. 1; however, other suitable circuit configurations may be utilized. Also, logic levels of signals may be different from or the opposite of those described. For example, a signal described as having a logic "high" level may alternatively have a logic "low" level, and a signal described as having a logic "low" level may alternatively have a logic "high" level.

In the embodiment of FIG. 3, the second mask signal generation circuit 24 may include a first drive circuit 241, a second drive circuit 242, a third drive circuit 243, a latch circuit 244 and a buffer circuit 245. As is apparent, the second mask signal generation circuit 24 of FIG. 3 may have the same or similar circuit configuration and operation as the first mask generation circuit 14 of FIG. 2.

In FIG. 3, the first drive circuit 241 may pull up a node nd23 to a logic "high" level in response to the power-up signal PWRUP and the second flag signal FLAG2. The first drive circuit 241 may terminate an operation for driving the node nd23 in response to the power-up signal PWRUP having a logic "high" level during the power-up period. The first drive circuit 241 may drive the node nd23 to a logic "high" level if the second flag signal FLAG2 has a logic "high" level by the calibration command cal_cmd inputted to the first channel circuit 1 (FIG. 1) while the power-up signal PWRUP has a logic "low" level.

The second drive circuit 242 may pull down the node nd23 to a logic "low" level in response to the power-up signal PWRUP and the second flag signal FLAG2. The second drive circuit 242 may terminate an operation for driving the node nd23 in response to the power-up signal PWRUP having a logic "high" level during the power-up period. The second drive circuit 242 may drive the node nd23 to a logic "low" level if the second flag signal FLAG2 has a logic "low" level by the calibration command cal_cmd inputted to the second channel circuit 2 (FIG. 1) while the power-up signal PWRUP has a logic "low" level.

The third drive circuit 243 may drive the node nd23 in response to the second transmission start signal TSTR2 and the second end signal ENDP2. The third drive circuit 243 may pull up the node nd23 to a logic "high" level if the second transmission start signal TSTR2 has a logic "low" level. The third drive circuit 243 may pull down the node nd23 to a logic "low" level if the second end signal ENDP2 has a logic "high" level.

The latch circuit 244 may latch a signal of the node nd23. The latch circuit 244 may latch a signal of the node nd23 to generate the second mask signal MASK2. The buffer circuit 245 may inversely buffer the second mask signal MASK2 to generate the second inverted mask signal MASK2B.

Figure 4:
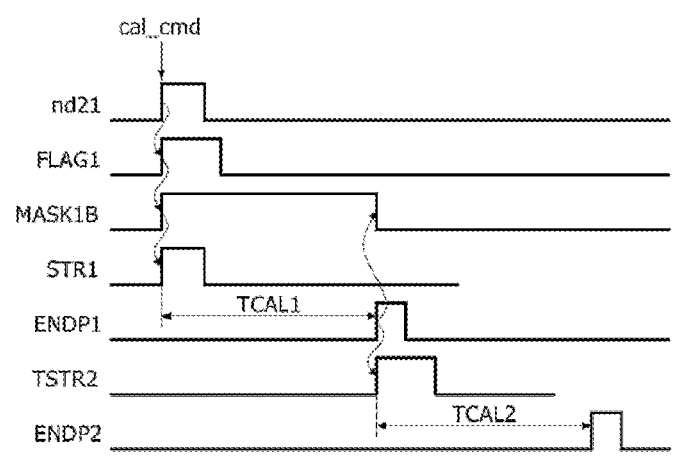
FIGS. 4 and 5 are timing diagrams illustrating operations of the semiconductor device shown in FIGS. 1 to 3.
Figure 5:
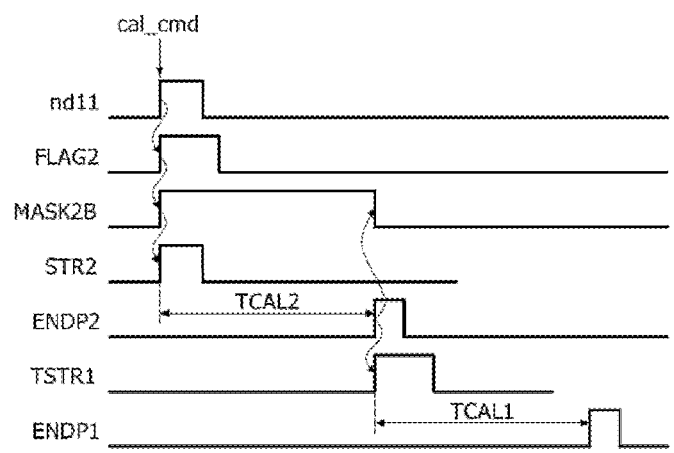

FIGS. 4 and 5 are timing diagrams illustrating operations of the semiconductor device shown and described in relation to FIGS. 1 to 3. These operations are described in conjunction with an example in which the calibration command cal_cmd is inputted to the node nd21 included in the second channel circuit 2 and an example in which the calibration command cal_cmd is inputted to the node nd11 included in the first channel circuit 1.

Again, logic levels of the signals may be different from or the opposite of those described. For example, a signal described as having a logic "high" level may alternatively have a logic "low" level, and a signal described as having a logic "low" level may alternatively have a logic "high" level.

As illustrated in FIG. 4, if the calibration command cal_cmd including a pulse having a logic "high" level is inputted to the node nd21 of the second channel circuit 2, the first flag signal FLAG1 may be enabled to have a logic "high" level. The calibration command cal_cmd may be transmitted to the first channel circuit 1 by the first flag signal FLAG1, and a level of the first inverted mask signal MASK1B may be switched from a logic "low" level to a logic "high" level. If the first inverted mask signal MASK1B has a logic "high" level, the calibration command cal_cmd inputted to the second channel circuit 2 may be buffered to change a level of the first start signal STR1 from a logic "low" level to a logic "high" level.

The first calibration operation may be executed by the first start signal STR1 having a logic "high" level. The first calibration operation may be executed during a first operation period TCAL1. A pulse having a logic "high" level of the first end signal ENDP1 may be created in synchronization with a point in time when the first operation period TCAL1 terminates. The pulse having a logic "high" level of the first end signal ENDP1 may change a level of the first inverted mask signal MASK1B from a logic "high" level to a logic "low" level. The pulse having a logic "high" level of the first end signal ENDP1 may be transmitted to the second channel circuit 2 to change a level of the second transmission start signal TSTR2 from a logic "low" level to a logic "high" level.

The second calibration operation may be executed by the second transmission start signal TSTR2 having a logic "high" level. The second calibration operation may be executed during a second operation period TCAL2. A pulse having a logic "high" level of the second end signal ENDP2 may be created in synchronization with a point in time when the second operation period TCAL2 terminates.

As illustrated in FIG. 5, if the calibration command cal_cmd including a pulse having a logic "high" level is inputted to the node nd11 of the first channel circuit 1, the second flag signal FLAG2 may be enabled to have a logic "high" level. The calibration command cal_cmd may be transmitted to the second channel circuit 2 by the second flag signal FLAG2, and a level of the second inverted mask signal MASK2B may be switched from a logic "low" level to a logic "high" level. If the second inverted mask signal MASK2B has a logic "high" level, the calibration command cal_cmd inputted to the first channel circuit 1 may be buffered to change a level of the second start signal STR2 from a logic "low" level to a logic "high" level.

The second calibration operation may be executed by the second start signal STR2 having a logic "high" level. The second calibration operation may be executed during the second operation period TCAL2. A pulse having a logic "high" level of the second end signal ENDP2 may be created in synchronization with a point in time when the second operation period TCAL2 terminates. The pulse having a logic "high" level of the second end signal ENDP2 may change a level of the second inverted mask signal MASK2B from a logic "high" level to a logic "low" level. The pulse having a logic "high" level of the second end signal ENDP2 may be transmitted to the first channel circuit 1 to change a level of the first transmission start signal TSTR1 from a logic "low" level to a logic "high" level.

The first calibration operation may be executed by the first transmission start signal TSTR1 having a logic "high" level. The first calibration operation may be executed during the first operation period TCAL1. A pulse having a logic "high" level of the first end signal ENDP1 may be created in synchronization with a point in time when the first operation period TCAL1 terminates.

According to the semiconductor device described above, the first and second channel circuits 1 and 2 may share the calibration command cal_cmd and the end signals to sequentially execute the calibration operations. Thus, it may be unnecessary to design the semiconductor device such that each of the first and second channel circuits 1 and 2 separately receives control signals such as the calibration command cal_cmd and the end signals. Accordingly, the number of pads of the semiconductor device may be reduced. Moreover, an impedance calibration operation of the first channel circuit 1 and an impedance calibration operation of the second channel circuit 2 may be sequentially executed to prevent malfunction which may occur when the impedance calibration operations of the first and second channel circuit 1 and 2 are simultaneously executed.

Figure 6:
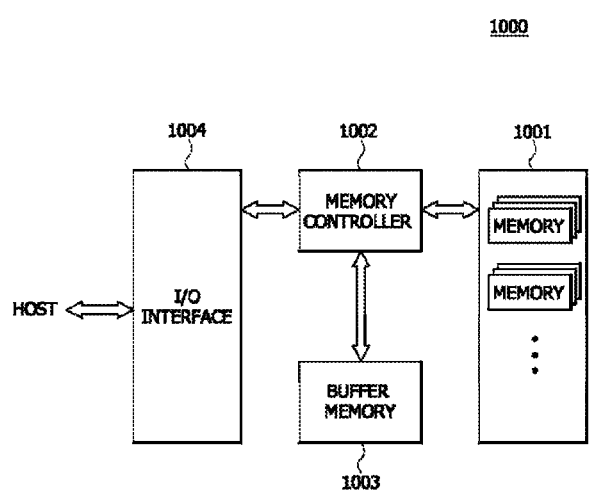
FIG. 6 is a block diagram illustrating a configuration of an electronic system including the semiconductor device shown in FIG. 1.

The semiconductor device described with reference to FIGS. 1 to 5 may be applied to an electronic system that includes a memory system, a graphic system, a computing system, a mobile system, or the like. For example, as illustrated in FIG. 6, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 6 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a first channel circuit of a first channel configured to drive a first node in response to a flag signal, configured to generate a start signal from a signal of the first node to execute a first calibration operation in response to a mask signal, and configured to generate and output an end signal after termination of the first calibration operation; and
   a second channel circuit of a second channel configured to generate a transmission start signal from the end signal to execute a second calibration operation,
   wherein the flag signal is set to a first level if a calibration command is inputted to a second node included in the second channel circuit and is set to a second level if the calibration command is inputted to the first node included in the first channel circuit.

2. The semiconductor device of claim 1, wherein the first channel circuit receives the calibration command inputted to the second node to drive the first node if the flag signal is set to the first level.

3. The semiconductor device of claim 1, wherein the first calibration operation is an operation that calibrates an impedance of an on-die termination (ODT) circuit included in the first channel circuit.

4. The semiconductor device of claim 1, wherein the second channel circuit includes an output driver that drives a first pad in response to a signal of the second node to which the calibration command is inputted.

5. The semiconductor device of claim 4, wherein the first channel circuit includes an input driver that drives the first node in response to a signal of a second pad connected to the first pad.

6. The semiconductor device of claim 5, wherein the first channel circuit further includes a start signal generation circuit that generates the start signal in response to the mask signal and a signal of the first node.

7. The semiconductor device of claim 1, wherein the first channel circuit includes an output driver that receives the end signal to drive a first pad in response to the mask signal.

8. The semiconductor device of claim 7, wherein the second channel circuit includes an input driver that drives the transmission start signal in response to a signal of a second pad connected to the first pad.

9. The semiconductor device of claim 1, wherein the first channel circuit includes a mask signal generation circuit that generates the mask signal driven in response to the flag signal and the end signal after termination of a power-up period.

10. A semiconductor device comprising:
    a first command input/output (I/O) circuit configured to be included in a first channel circuit of a first channel and configured to receive a signal of a first pad to drive a first node in response to a first flag signal or to receive a signal of the first node to drive the first pad in response to the first flag signal;
    a first start signal generation circuit configured to be included in the first channel circuit and configured to buffer a signal of the first node to generate a first start signal for a first calibration operation in response to a first mask signal; and a first end pulse input/output (I/O) circuit configured to be included in the first channel circuit and configured to drive a second pad in response to a first end signal generated after termination of the first calibration operation or to drive a first transmission start signal for the first calibration operation in response to a signal of the second pad.

11. The semiconductor device of claim 10, wherein the first flag signal is set to a first level if a calibration command is inputted to a second node included in a second channel circuit and is set to a second level if the calibration command is inputted to the first node included in the first channel circuit.

12. The semiconductor device of claim 11, wherein the first command I/O circuit includes:

an input driver configured to drive the first node in response to a signal of the first pad if the first flag signal has the first level; and an output driver configured to drive the first pad in response to a signal of the first node if the first flag signal has the second level.

13. The semiconductor device of claim 10, wherein the first end pulse I/O circuit includes:

an output driver configured to receive the first end signal to drive the second pad in response to the first mask signal; and an input driver configured to receive a signal of the second pad to drive the first transmission start signal in response to a second mask signal.

14. The semiconductor device of claim 10, further comprising a first mask signal generation circuit configured to be included in the first channel circuit and configured to generate the first mask signal that is driven in response to the first flag signal, the first end signal and the first transmission start signal after termination of a power-up period.

15. The semiconductor device of claim 14, wherein the first mask signal generation circuit includes:

a first drive circuit configured to drive an internal node to a first level in response to a power-up signal and the first flag signal; and a second drive circuit configured to drive the internal node to a second level in response to the power-up signal and the first flag signal.

16. The semiconductor device of claim 15, wherein the first mask signal generation circuit further includes a third drive circuit configured to drive the internal node in response to the first transmission start signal and the first end signal.

17. The semiconductor device of claim 10, further comprising a second command I/O circuit configured to be included in a second channel circuit of a second channel and configured to receive a signal of a third pad to drive a second node in response to a second flag signal or to receive a signal of the second node to drive the third pad in response to the second flag signal.

18. The semiconductor device of claim 10, further comprising a second start signal generation circuit configured to be included in a second channel circuit of a second channel and configured to buffer a signal of a second node to generate a second start signal for a second calibration operation in response to a second mask signal.

19. The semiconductor device of claim 10, further comprising a second end pulse I/O circuit configured to be included in a second channel circuit of a second channel and configured to drive a third pad in response to a second end signal generated after termination of a second calibration operation or to drive a second transmission start signal for the second calibration operation in response to a signal of the third pad.

20. The semiconductor device of claim 14, further comprising a second mask signal generation circuit configured to be included in a second channel circuit of a second channel and configured to generate a second mask signal that is driven in response to the second flag signal, a second end signal and a second transmission start signal after termination of a power-up period.

* * * * *